US005528083A

United States Patent [19]
Malladi et al.

[11] Patent Number: 5,528,083
[45] Date of Patent: Jun. 18, 1996

[54] THIN FILM CHIP CAPACITOR FOR ELECTRICAL NOISE REDUCTION IN INTEGRATED CIRCUITS

[75] Inventors: Deviprasad Malladi, Campbell; Eric L. Bogatin, San Jose; Bahram Zand, Laguna Niguel, all of Calif.

[73] Assignee: Sun Microsystems, Inc., Mountain View, Calif.

[21] Appl. No.: 317,900

[22] Filed: Oct. 4, 1994

[51] Int. Cl.⁶ .......................... H01L 23/12; H01L 23/14; H01L 23/522
[52] U.S. Cl. .......................... 257/786; 257/784; 257/723; 257/924
[58] Field of Search .................... 257/784, 786, 257/916, 723, 924

[56] References Cited

U.S. PATENT DOCUMENTS

| | | | |
|---|---|---|---|
| 4,945,399 | 7/1990 | Brown et al. | 257/784 |
| 4,989,117 | 1/1991 | Hernandez | 257/916 |
| 4,994,936 | 2/1991 | Hernandez | 257/916 |
| 5,049,979 | 9/1991 | Hashemi et al. | 357/75 |
| 5,103,283 | 4/1992 | Hite | 257/916 |
| 5,134,539 | 7/1992 | Tuckerman et al. | 361/311 |
| 5,274,270 | 12/1993 | Tuckerman | 257/758 |
| 5,311,057 | 5/1994 | McShane | 257/784 |

OTHER PUBLICATIONS

Hashemi et al., "The Close Attached Capacitor: A Solution to Switching Noise Problems," IEEE, May 1992.
Loo et al., "Area Array Chip Carrier: SMT Package for Known Good Die," ISHM 1993 Proceedings.
Matthew et al., "Future Directions in TAB: The TCC/MCM Interconnect," Tessera, Inc.
"Tessera Compliant Chip Technology Overview," Tessera, Inc.

Primary Examiner—Robert P. Limanek
Assistant Examiner—David B. Hardy
Attorney, Agent, or Firm—Hickman & Beyer

[57] ABSTRACT

An integrated circuit chip and flat capacitor assembly are connected with short bonding wires to reduce electrical noise. A flat chip capacitor is coupled to the chip and includes a first electrode, a second electrode and a dielectric layer disposed between the electrodes. The ground and power bonding pads of an integrated circuit chip are coupled to a number of terminals arranged in a row near the outer edge of the capacitor, where each of the terminals is coupled to one of the electrodes. The terminals of the capacitor are connected to a number of package leads of a lead frame or a other integrated circuit package. The invention includes embodiments in which the chip is placed on top of the capacitor, the capacitor is placed on top of the chip, and a flex circuit of a micro ball grid array is placed on a capacitor which is positioned on a chip.

30 Claims, 5 Drawing Sheets

THIN FILM CHIP CAPACITOR FOR ELECTRICAL NOISE REDUCTION IN INTEGRATED CIRCUITS

BACKGROUND OF THE INVENTION

The present invention relates generally to integrated circuits, and more specifically to reducing electrical noise for an integrated circuit chip.

Integrated circuits are used widely for a variety of applications. An integrated circuit is commonly manufactured as a small die or chip of silicon material with many circuits etched onto the chip. The inputs and outputs to the circuits are typically routed to the edges of the chip and are connected to bonding pads which are linearly arranged around the perimeter of the chip. The bonding pads include signal pads which route signals to and from the circuits on the chip as well as ground and power pads for providing reference voltages to the circuits of the chip. The bonding pads are typically connected to the lead tips of a lead frame using bonding wires or a tape automated bonding (TAB) process.

In a typical integrated circuit, a bypass capacitor is connected to the bonding pads to suppress electrical noise which is caused by a large number of circuits switching simultaneously. The electrical noise can cause rise time degradation and false gate switching. Typically, the bypass capacitor is placed near the package body which surrounds the integrated circuit chip and is connected between the lead frame and the chip using bonding wires. However, a problem of using a bypass capacitor is that the bonding wires which connect the capacitor to the integrated circuit chip have an inherent inductance which can add to the electrical noise of the circuit. The longer the bonding wires, the more inductance is added, and the more electrical noise is caused. If the bonding wires are long enough, the added electrical noise cannot be suppressed by the bypass capacitor.

The problem of long bonding wires for bypass capacitors in integrated circuits has been addressed in the prior art. U.S. Pat. No. 5,049,979 of Hashemi et al. describes a combined flat capacitor and tab integrated circuit chip which provides short bonding wires to connect the capacitor to the bonding pads of the chip. This prior art combined capacitor and chip is shown in FIGS. 1a, 2b and 2 where an integrated circuit chip 10 includes a number of bonding pads 12 positioned near the edge of the chip. Ground and power bonding pads 13 are connected to ground or power circuits which provide a reference voltage for the chip 10. A flat capacitor 14 is attached to the top surface of the chip 10 and includes top electrode 16 and bottom electrode 18 with dielectric layer 19 positioned between the electrodes. A number of terminals 20 and 22 are positioned on the outer peripheries of electrode 16 and electrode 18, where inner terminals 20 are connected to electrode 16 and outer terminals 22 are connected to electrode 18. Capacitor 14 has a smaller area than the chip 16, allowing the terminals 20 and 22 to be aligned with the bonding pads 12 and provide a short interconnection distance between the capacitor terminals and bonding pads. Bonding wires 24 are used to connect the ground and power bonding pads 13 to the terminals 20 and 22 of capacitor 14, where the ground and power bonding pads are shown having a larger area.

As shown in FIG. 2, bonding wires 24 connect the ground and power bonding pads 13 of the prior art integrated circuit chip to the terminals of the capacitor 14. These wires are short so that electrical noise from inductance in the wires is not a great problem, permitting capacitor 14 to more effectively suppress the electrical noise in the circuits of chip 10. Bonding finger wires 26 are used to connect bonding pads 12 with bonding fingers 28, which are positioned in the same plane as the surface of chip 10 and spaced apart from the chip. The bonding fingers are coupled to a lead frame that provides electrical leads to the exterior of the chip package.

A problem occurs when more than one bonding wire 24 and 26 is connected to a ground or power bonding pad 13. Bonding pad 13 is typically made larger to accommodate the extra bonding wire to the capacitor. The larger bonding pad uses up more active area on the chip 10 that could be used for circuitry or other needed components. In addition, a chip must be modified to include the larger bonding pads and, possibly, include a modified bonding pad pitch for spacing the pads. This causes an integrated circuit chip to cost more and require more time to produce. Another problem with the capacitor and integrated circuit combination of the prior art is that the capacitor size is limited to a size smaller than the integrated circuit chip size. Thus, if a larger capacitor is needed to suppress a certain amount of electrical noise, the required capacitor size may not fit in the allowed space on top of the chip, leading to more electrical noise problems.

What is needed is a integrated circuit chip and capacitor that provides short bonding wires for the suppression of electrical noise and also allows a standard chip bonding pad configuration to be used with uniformly-sized bonding pads. What is also needed is an integrated circuit chip and capacitor which allow the capacitor size to be increased past the size of the integrated circuit chip for more effective noise suppression.

SUMMARY OF THE INVENTION

An apparatus and method is disclosed for an integrated circuit chip and flat capacitor assembly which are connected with short bonding wires to reduce electrical noise. The capacitor is coupled between bonding pads on the chip and leads which connect the chip to an external communication location. The present invention provides bonding pads on the chip which have a single, standard size and does not require larger pads for power and ground connections, thus saving cost and time in producing the chips.

An integrated circuit chip and capacitor assembly of the present invention includes an integrated circuit chip having bonding pads arranged in a row around the periphery of the chip. A flat chip capacitor is coupled to the chip and includes a first electrode, a second electrode and a dielectric layer disposed between the electrodes. A number of terminals are arranged in a row near the outer edge of the capacitor, where each of the terminals is coupled to one of the electrodes. Bonding wires are used to connect the bonding pads on the chip to the terminals on the capacitor. Package bonding wires are used to connect the terminals of the capacitor to a number of package leads of a package. Preferably, the terminals of the capacitor are alternately coupled to the first electrode and the second electrode. The bonding pads include ground bonding pads and power bonding pads to provide ground and power reference voltages to the chip. Only the ground bonding pads and the power bonding pads are connected to the terminals of the capacitor.

In one embodiment, the chip has a smaller area than the capacitor and is coupled to the top side of the capacitor. The flat chip capacitor includes a first electrode, a second electrode and a dielectric layer disposed between said first and second electrodes. The capacitor also includes a row of inner terminals positioned on the capacitor proximate to the bonding pads of the chip, and a row of outer terminals corresponding to the inner terminals and positioned proximate the outer periphery of the capacitor. Each inner terminal is coupled to one of the electrodes, and each outer terminal is coupled to the same electrode which is coupled to its corresponding inner terminal. Bonding wires connect the bonding pads of the chip to the inner terminals of the capacitor. Bonding finger wires connect the outer terminals of the capacitor to bonding fingers of a lead frame package. The inner terminals are preferably aligned with the bonding pads. Alternatively, the inner terminals and outer terminals can include ground and power rails.

In another embodiment, the flat chip capacitor has a smaller area than the chip and is coupled to the top side of the chip. The capacitor is coupled to the top side of the chip and includes a first electrode, a second electrode, and a dielectric layer. The capacitor also includes a number of terminals, each terminal being coupled to one of the electrodes. A number of bonding wires connect the bonding pads of the chip to the terminals of the capacitor. A number of bonding finger wires connect the terminals of the capacitor to bonding fingers aligned with said bonding pads and positioned outside the periphery of the chip.

In yet another embodiment, a flat chip capacitor has a smaller area than the chip and is coupled to the top side of the chip. The capacitor includes a number of inner terminals and outer terminals, each coupled to one of the electrodes. A flex circuit which has a smaller area than the capacitor is coupled to the top surface of the capacitor. The flex circuit has a number of ball contacts on an exposed surface and a corresponding number of leads which preferably extend out the sides of the flex circuit and are connected to the ball contacts. A number of bonding wires connect the bonding pads of the chip to the outer terminals of the capacitor. A number of lead wires connect the inner terminals of the capacitor to the leads of the flex circuit. Preferably, an elastomer layer couples the capacitor to the chip.

The present invention permits all the bonding pads of an integrated circuit chip to be manufactured at a constant size and pitch, since only one set of wires are connected to the ground and power bonding pads of the chip. The present invention also provides a larger capacitor for reducing the self-inductance in the circuit without lengthening the bonding wires.

These and other advantages of the present invention will become apparent to those skilled in the art alter reading the following descriptions and studying the various figures of the drawings.

BRIEF DESCRIPTION OF THE DRAWINGS

The invention may best be understood by reference to the following description taken in conjunction with the accompanying drawings in which:

FIG. 1b is a side elevation view of the integrated circuit and capacitor assembly shown in FIG. 1a;

FIG. 3b is a side elevation view of the chip and capacitor assembly shown in FIG. 3a;

FIG. 4 is a perspective view of the chip and capacitor assembly shown in FIG. 3a;

FIG. 7b is a side elevation view of the chip and capacitor assembly shown in FIG. 7a; and FIG. 8 is a perspective view of the chip and capacitor assembly shown in FIG. 7a.

DETAILED DESCRIPTION OF THE INVENTION

The present invention is described below with reference to an integrated circuit chip connected to bonding fingers of a lead frame. However, the present invention is also suitable for integrated circuit chips used in other die packages having bonding pads or other types of contacts which connect to the bonding pads of an integrated circuit chip.

Figure 1A:
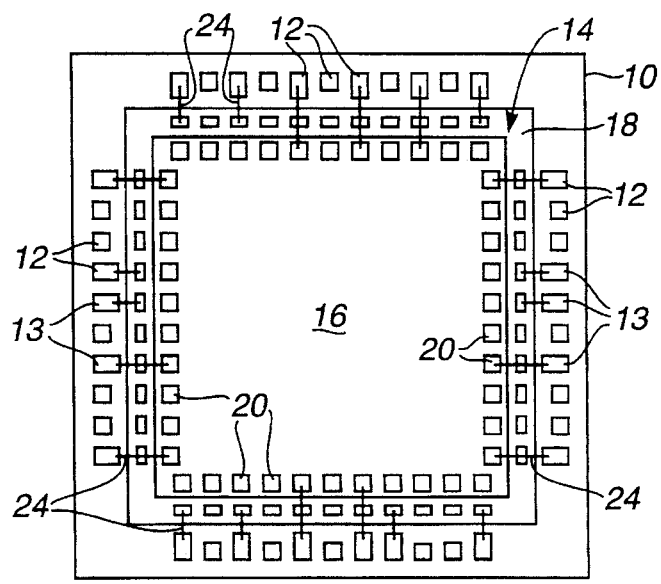
FIG. 1a is a top plan view of an integrated circuit chip and flat capacitor assembly of the prior art.
Figure 1B:
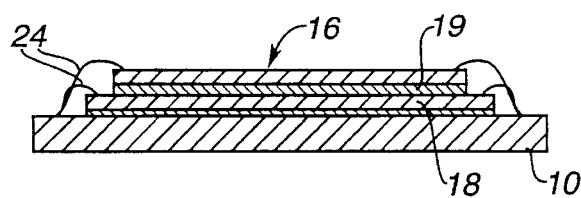
Figure 2:
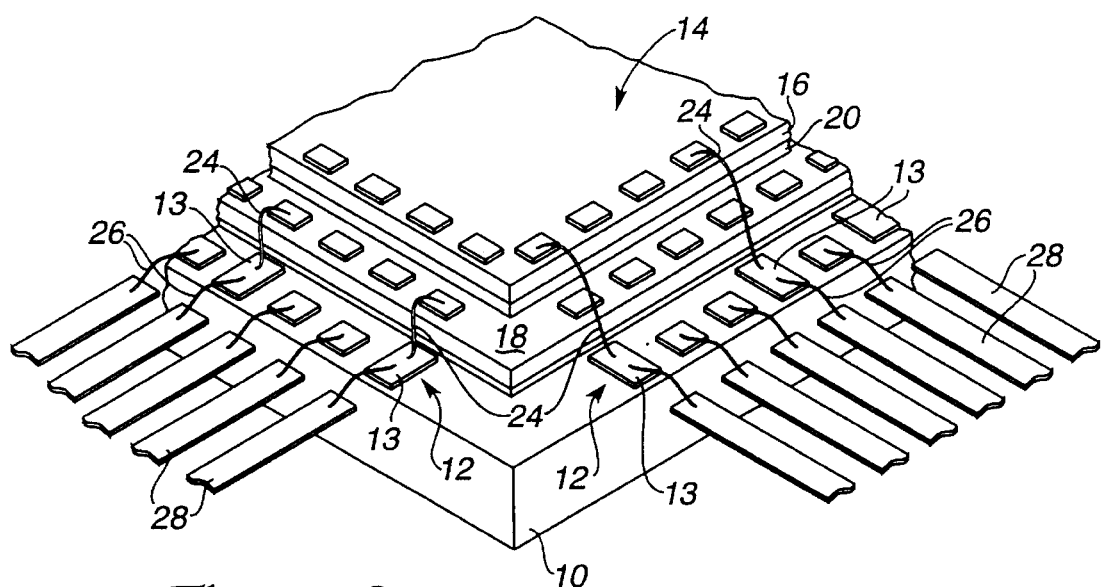
FIG. 2 is perspective view of the chip and capacitor assembly shown in FIG. 1.
Figure 3A:
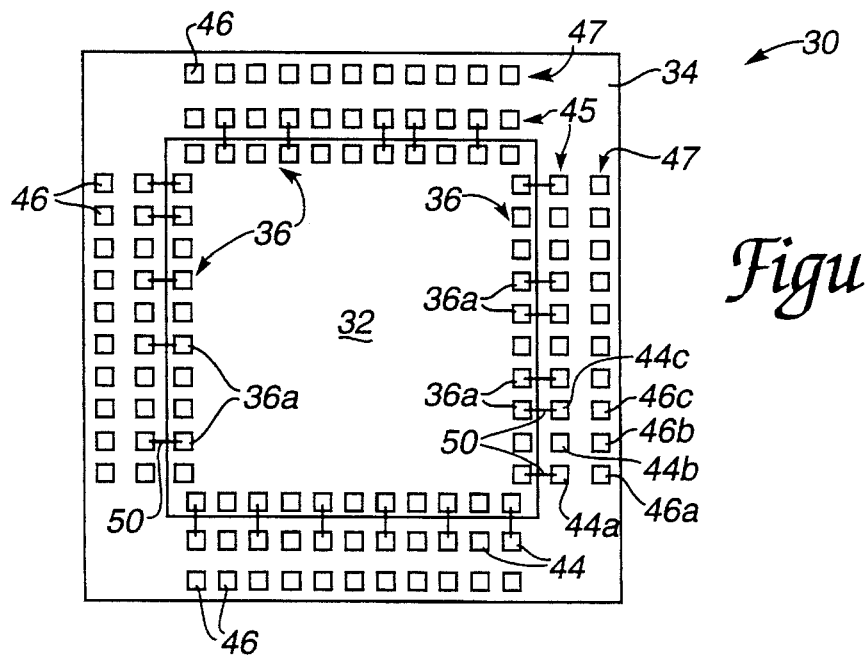
FIG. 3a is a top plan view of a first embodiment of an integrated circuit and flat capacitor assembly in accordance with the present invention.
Figure 3B:
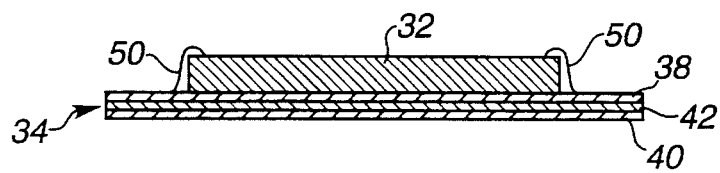

FIGS. 3a and 3b are top and side views, respectively, of a first embodiment of the integrated circuit chip and flat capacitor of the present invention. A chip-capacitor assembly 30 includes an integrated circuit chip 32 and a flat capacitor 34. Capacitor 34 is preferably coupled to chip 32 by a standard non-conductive adhesive used for attaching integrated circuit dies, such as epoxy, polyimid, etc. Integrated circuit chip 32 is any type of die that includes a number of bonding pads 36 positioned on the upper surface and near the outer edge of the chip. These bonding pads are typically arranged so that some of the pads are signal pads, and some of the pads are ground pads and power pads. The ground and power pads 36a are connected to the capacitor 34. In the present invention, the ground and power bonding pads 36a do not have to be made larger than signal pads, since the wiring process of the present invention uses only one wire connection for each bonding pad on the chip 32 (described below).

Flat capacitor 34 includes a first (top) electrode (or plate) 38, a second (bottom) electrode (or plate) 40, and a dielectric layer 42 positioned between the first electrode 38 and second electrode 40. In the described embodiment, first and second electrodes 38 and 40 are preferably made of a conductive material, such as aluminum, and are about 2 μm in height. Dielectric layer 42 is preferably made of a material such as aluminum oxide, and is about 0.15 μm in height. The total height of the capacitor is thus about 4.15 μm. A flat capacitor which includes a small separation between the electrodes and a large area, as described, is desirable to reduce the self-inductance of the capacitor. The self-inductance of a capacitor can limit the use of high-frequency signals in operating integrated circuit chip 32. In other embodiments, the dimensions of the capacitor electrodes and dielectric may vary, depending on the particular application.

In the embodiment of FIG. 3a and 3b, capacitor 34 includes two rows 45 and 47 of terminals 44 and 46 positioned near the outer periphery of the capacitor running parallel to the edges of the capacitor. Row 45 of inner terminals 44 is positioned closer to the center of capacitor 34 than row 47 of outer terminals 46 and is preferably situated close to the edge of integrated circuit chip 32. Each terminal 44 is also preferably aligned with a corresponding bonding pad 36 of chip 32. Each terminal 44 is electrically coupled to either first electrode 38 or second electrode 40. In the described embodiment, consecutive terminals 44 are alternately coupled to first electrode 38 and second electrode 40, so that, for example, terminal 44a is coupled to first electrode 38, terminal 44b is coupled to second electrode 40, terminal 44c is coupled to first electrode 38, and so on. Terminals 44 which are coupled to second electrode 40 are routed down to second electrode 40 and insulated from contact with first electrode 38.

Row 47 of outer terminals 46 is positioned closer to the outer edge of capacitor 34 than terminals 44. Outer terminals 46 are preferably aligned and have a one-to-one correspondence with inner terminals 44. Each outer terminal 46 is coupled to the electrode 38 or 40 to which a corresponding inner terminal 44 is coupled. For example, outer terminal 46a is coupled to the same electrode as inner terminal 44a, outer terminal 46b is coupled to the same electrode as inner terminal 44b, etc. The arrangement of the terminals 44 and 46 shown in FIGS. 3a, 3b, and 4 are only exemplary, and the actual arrangement may vary according to a specific application.

Bonding wires 50 are made of a conductive material, such as gold, and are used to electrically connect the ground and power bonding pads 36a to inner terminals 44 of capacitor 34. As shown in FIG. 3b, these wires can be bonded using well-known methods in an "S" shape to allow more flexibility in case of stress to assembly 30. In an alternate embodiment, bonding pads 36a can be electrically connected to terminals 44 using a different method. For example, in a "flip-chip" configuration, chip 32 is turned to face the opposite direction as shown in FIGS. 3a and 3b so that bonding pads 36 face the surface of capacitor 34 on which the terminals are positioned. The bonding pads 36 directly contact inner terminals 44 which are positioned in the same configuration and spacing of the bonding pads. A flip-chip connecting procedure is well-known to those skilled in the art.

Figure 4:
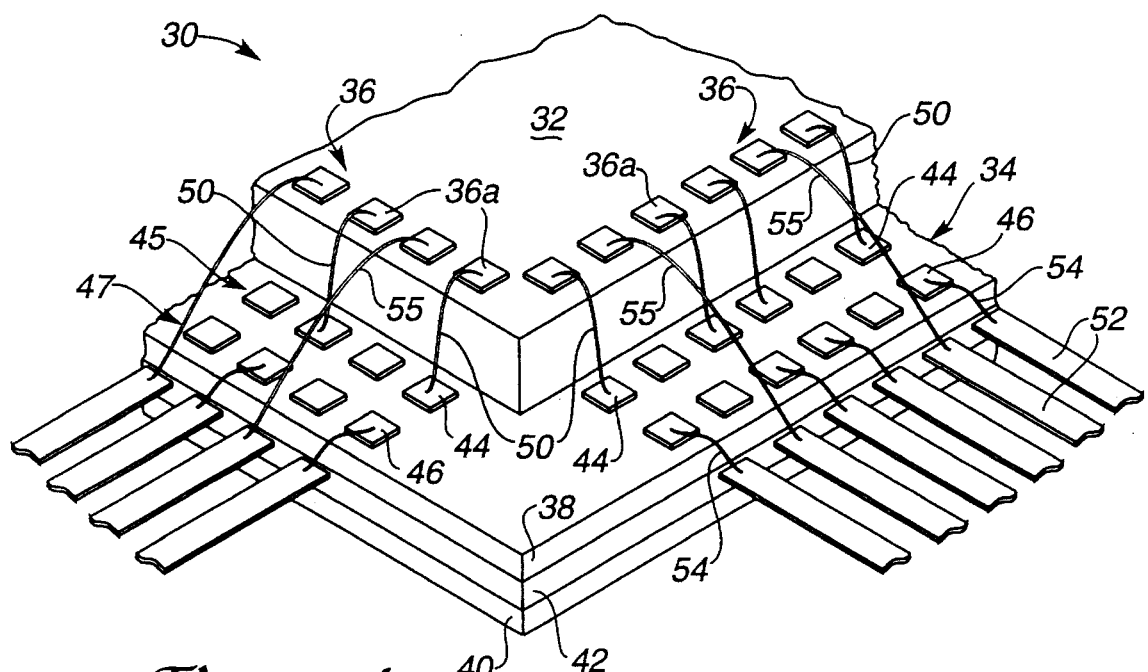

FIG. 4 is a perspective view of a portion of the integrated circuit chip and capacitor assembly 30 shown in FIGS. 3a and 3b. Bonding wires 50 are shown connecting terminals 44 to bonding pads 36 of a semiconductor device package. Portions of bonding fingers 52 are also shown in FIG. 4. The bonding fingers are coupled to a lead frame (not shown) surrounding the assembly and extend to the outside of the package, typically being coupled to and providing signals to and from a location external to the chip. In the described embodiment, each bonding finger 52 is coupled to an outer terminal 46 by a bonding finger wire 54. Alternatively, bonding pads 46 can be connected to outside circuits or terminals and secured in place with tape in a TAB bonding procedure, as is well known to those skilled in the art. Wires 55 connect the bonding pads 36 which are not power or ground bonding pads (signal pads, etc.) to bonding fingers 52. When making a chip-capacitor assembly 30, the bonding wires 50 are preferably connected first when constructing the assembly, and the assembly is then connected to the bonding fingers 52 of the lead frame with wires 54 and 55. In alternate embodiments, other types of semiconductor packages besides lead frames can be used. For example, an insulating package having a number of bonding pads in place of bonding fingers 52 can be connected to the terminals of capacitor 34 and chip 32. Bonding fingers 52 or other types of connections on the package can be considered package "leads" which are connected to assembly 30 by package bonding wires such as bonding finger wires 54 and wires 55.

Since the capacitor 34 is positioned underneath integrated circuit chip 32, only one wire is connected to each of the power and ground bonding pads 36a of the integrated circuit chip. These bonding pads therefore do not have to be increased in size to accommodate connections to two or more bonding wires. In addition, the position of capacitor 34 underneath chip 32 allows capacitor 34 to be increased in area, which helps reduce the self-inductance of the capacitor. The use of two rows of terminals 44 and 46 in the embodiment shown in FIG. 4 allows the capacitor 34 to be increased in area without having to increase the size of bonding wires 50 and 54. For example, if capacitor 34 were increased in length and width, the outer edge of capacitor 34 would be a greater distance from chip 32. To prevent bonding finger wires 54 from being too long and increasing the inductance of the connection, outer terminals 46 can be moved close to the outer edge of the capacitor. Bonding finger wires 54 can thus remain a constant length regardless of the size of capacitor 34.

Figure 5:
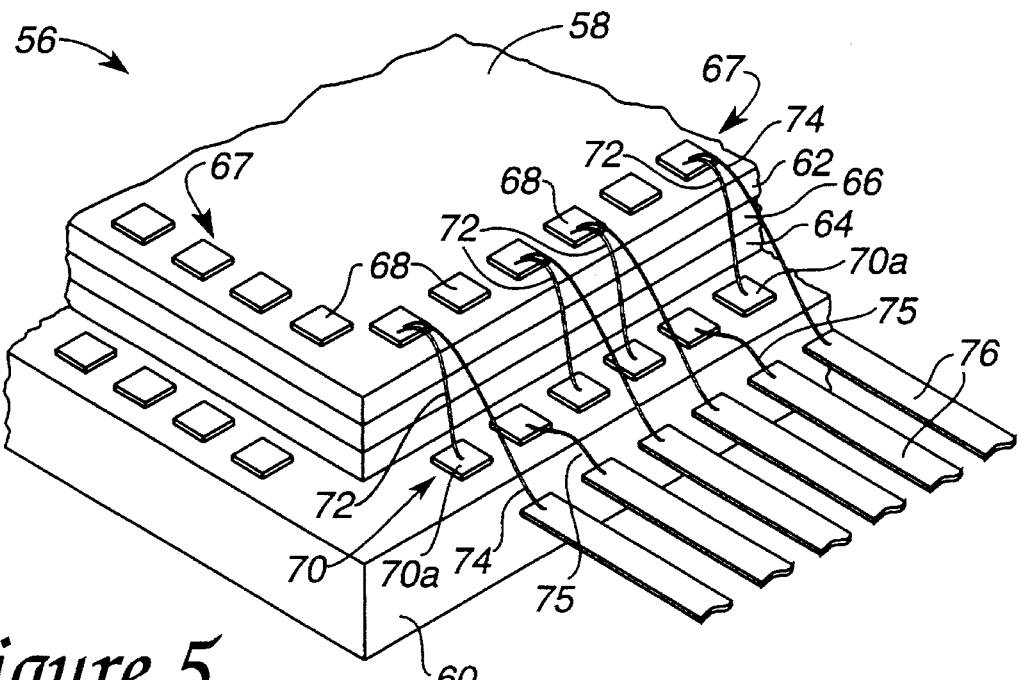
FIG. 5 is a perspective view of a second embodiment of an integrated circuit chip and flat capacitor assembly in accordance with the present invention.

FIG. 5 is a perspective diagram of a portion of a second embodiment of an integrated circuit chip and capacitor assembly 56. Assembly 56 includes a capacitor 58 and an integrated circuit chip 60. In this embodiment, capacitor 58 is smaller than chip 60 and is positioned on the side of the chip on which the bonding pads of the chip are positioned. Similar to the first embodiment assembly 30 shown in FIGS. 3a, 3b and 4, capacitor 58 includes a first electrode 62, a second electrode 64, and a dielectric layer 66 having similar structure and function as the equivalent layers of the capacitor of assembly 30 of FIG. 4. A single row 67 of terminals 68 is positioned close to the outer edges of capacitor 58. Preferably, terminals 68 are alternately coupled to first electrode 62 and second electrode 64, similar to the terminals 44 and 46 of FIG. 4. In an alternate embodiment, the second electrode 64 can be made with a larger area than first electrode 62, and terminals 68 which are coupled to the second electrode can be positioned on the second electrode near its outer edges. Similarly, terminals 68 which are coupled to the first electrode can be positioned on the first electrode near its outer edges.

Integrated circuit chip 60 is positioned under capacitor 58 and includes a single row of bonding pads 70 including signal pads, ground pads, and power pads. Similar to the chip 32 of FIGS. 3a, 3b, and 4, ground and power bonding pads 70a are the same size as the signal bonding pads and are preferably aligned with terminals 68 of capacitor 58. Bonding wires 72 are coupled between terminals 68 and bonding pads 70a by well-known methods such that each terminal 68 is coupled to an aligned ground or power pad of chip 60. Bonding finger wires 74 are coupled between terminals 68 and a plurality of bonding fingers 76 such that each terminal that is connected to a bonding pad 70a is connected to an aligned bonding finger 76. Bonding pads 70 which are not ground or power bonding pads are connected to bonding fingers 76 by wires 75. As in FIG. 4, bonding fingers 76 can be coupled to a location external to the chip 60 and thus provide a signal communication pathway between the external location and the circuits of chip 60. Terminals 68 of the capacitor can be made larger than bonding pads 70 in order to accommodate two wire connections. As in the embodiment of FIG. 4, alternate package leads can be used instead of bonding fingers 76, such as package bonding pads.

The embodiment of FIG. 5 allows the bonding pads 70 of chip 60 to be the same size regardless of whether the pads are signal, power, or ground pads. Since larger pads for two or more connections to wires can be provided on capacitor 58 rather than chip 60, all of bonding pads 70 can be made the same size, reducing cost and time to manufacture chip 60. In addition, bonding wires 72 and 74 are short and thus provide less inductance in the wires than if a capacitor were not positioned close to chip 60.

Figure 6:
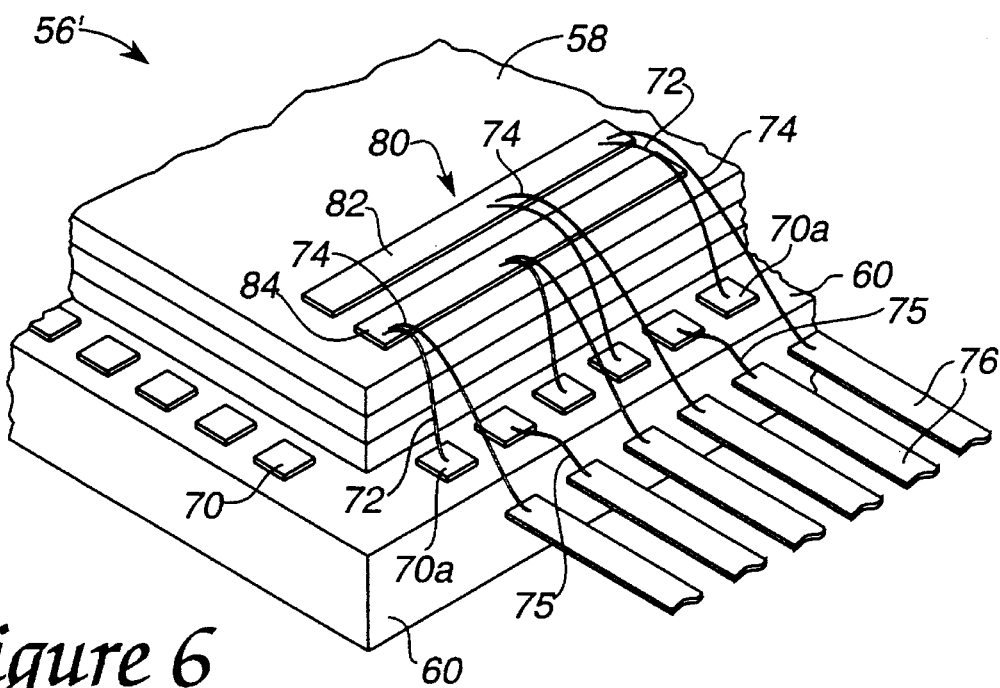
FIG. 6 is a perspective view of an alternate embodiment of the chip and capacitor assembly shown FIG. 5.

FIG. 6 is a perspective diagram of a portion of a alternate embodiment 56' of the chip-capacitor assembly 56 shown in FIG. 5. Assembly 56' includes a capacitor 58 positioned on the bonding-pad side of an integrated circuit chip 60, similar to assembly 56. Like assembly 56, bonding wires 72 couple the power and ground bonding pads 70a of chip 60 to the capacitor, and bonding finger wires 74 couple bonding fingers 76 which are aligned with power or ground bonding pads to the capacitor. In FIG. 6, however, capacitor 58 includes one or more power and ground rails 80. Rails 80 are positioned near the outer edges of capacitor 58 and include a ground rail 82 and a power rail 84. The ground rail is preferably coupled to one electrode and the power rail is preferably coupled to the other electrode. The bonding pads 70a which are ground pads are connected to ground rail 82, and the bonding pads 70a which are power pads are connected to power rail 84. Rails 80 provide some flexibility and more area in which to connect the multiple bonding wires than the embodiment shown in FIG. 5. Either ground rail 82 or power rail 84 can be positioned closer to the outer edges of capacitor 58.

Figure 7A:
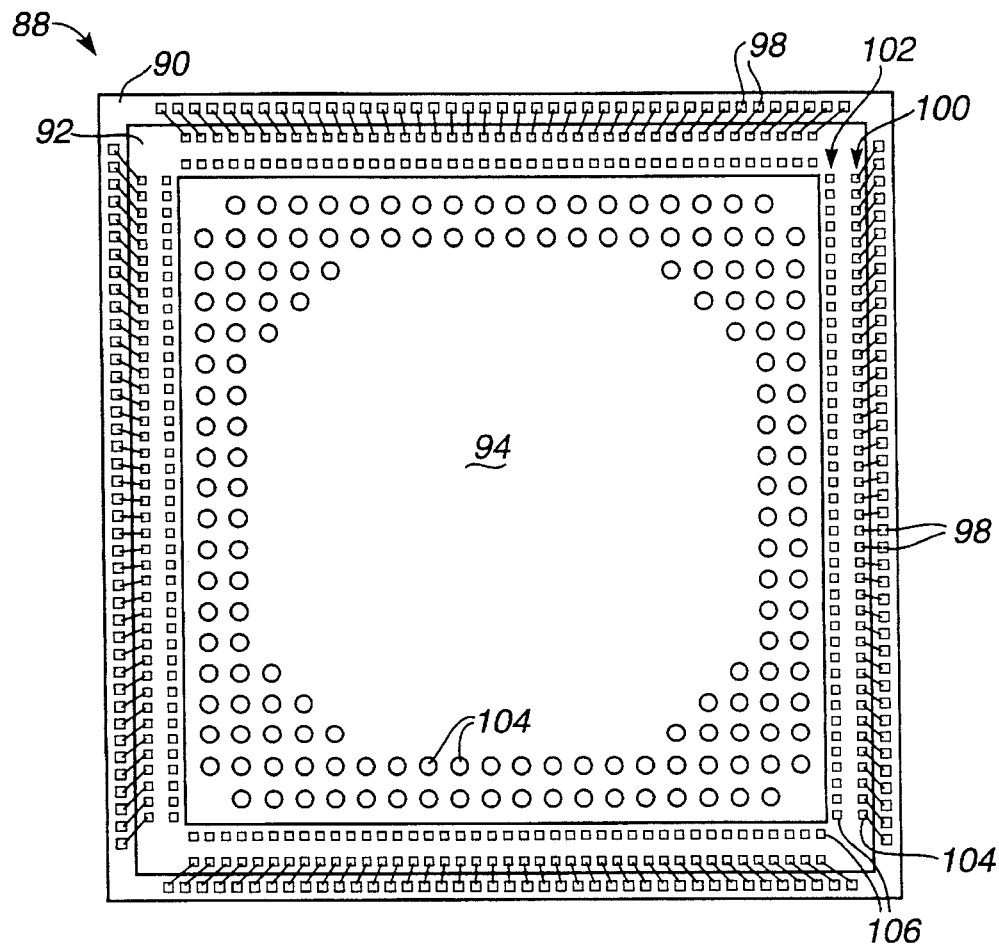
FIG. 7a is a plan view of a third embodiment of an integrated circuit chip and flat capacitor assembly in accordance with the present invention.
Figure 7B:
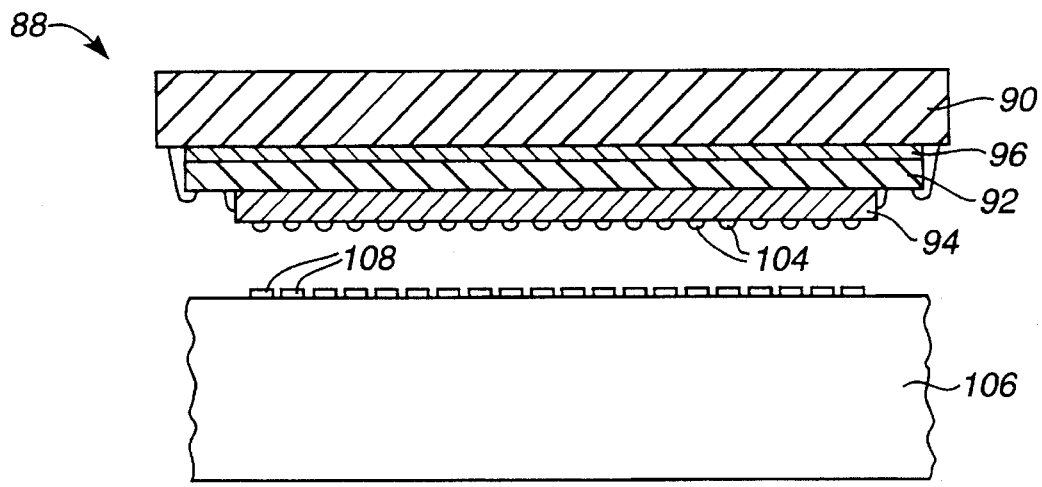

FIG. 7a is a bottom view of a third embodiment of a chip-capacitor assembly 88, and FIG. 7b is a side view of assembly 88 and a socket for connecting the assembly. Assembly 88 includes an integrated circuit chip 90, a flat capacitor 92, and a flex circuit 94. Capacitor 92 is coupled to the top side of chip 90 by elastomer layer 96 (FIG. 7b). The elastomer layer allows the capacitor to flex in case stress is applied to assembly 88, such as occurs when the assembly is connected to a testing socket. Flex circuit 94 is coupled to the top side of capacitor 92 by well-known adhesives, such as epoxy.

Integrated circuit chip 90 includes a single row of bonding pads 98 positioned near the outer edges of the chip. Capacitor 92 includes two rows 100 and 102 of terminals which are aligned with bonding pads 98 of chip 90, where one row 100 of outer terminals 104 is positioned near the outer edge of the capacitor and the other row 102 of inner terminals 106 is positioned further from the outer edge and close to the outer edge of flex circuit 94. Inner terminals 106 are coupled to corresponding package leads included on flex circuit 94, shown in greater detail with respect to FIG. 8.

Flex circuit 94 is made of an insulating material such as polyimide. A number of leads (see FIG. 8) extend from each side of the flex circuit and have a one-to-one correspondence with the number of bonding pads 98 of chip 90. A number of ball contacts 104 are provided on the bottom surface of flex circuit 94 in a configuration having several rows positioned near the outer edges of the flex circuit. The leads extending from the edges of the flex circuit are each electrically coupled to a ball contact 104 by internal wiring within the insulating material of the flex circuit.

Connection base 106 is used to electrically couple the circuits of integrated circuit chip 90 with other circuits and components external to the chip and can be, for example, a printed circuit board. Electrical contacts 108 have a one-to-one correspondence with ball contacts 104. Assembly 88 is lowered down so that ball contacts 104 engage electrical contacts 108. The ball contacts can be soldered in place when engaging contacts 108 to secure assembly 88 in place. Alternately, a socket having similar contacts and an additional holding structure can be used to hold assembly 88. Flex circuits having ball contacts 104, known as micro ball grid arrays (μBGA's), are well known to those skilled in the art for providing a reliable, robust test or contact surface for a chip which prevents the chip from being damaged in multiple tests or in connecting a chip to a circuit.

The embodiment 88 of the present invention provides a capacitor close to the bonding pads of the integrated circuit chip so that the bonding wires to the bonding pads and to the bonding fingers are much reduced in length, reducing the electrical noise in the circuits of chip 90. In the prior art, capacitors are provided on or near socket 106 and longer bonding wires must be used to connect the capacitors to the bonding pads of the chip, causing more inductance in the circuit.

Figure 8:
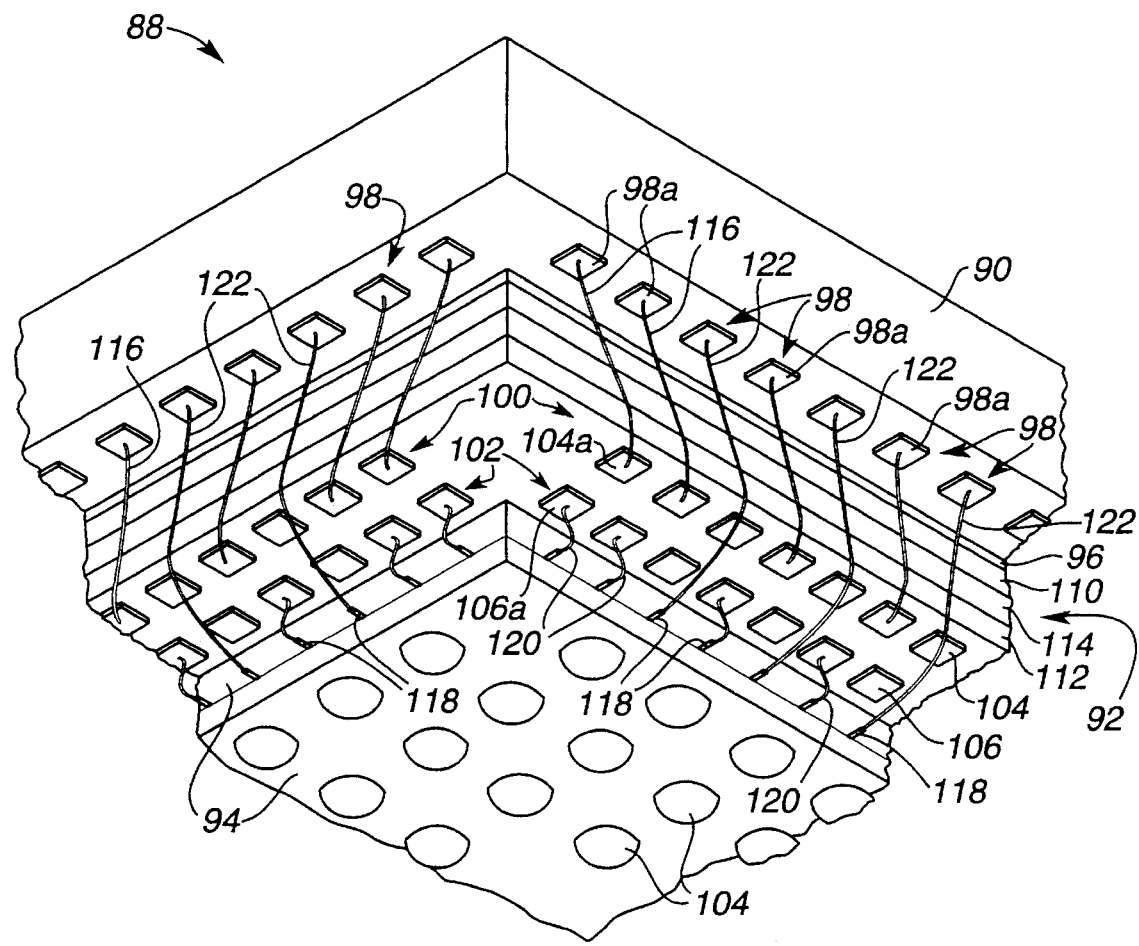

FIG. 8 is a perspective view of a portion of the chip-capacitor assembly 88 shown in FIG. 7a. Capacitor 92 includes a first electrode 110, a second electrode 112, and a dielectric layer 114 positioned between the first and second electrodes. Preferably, alternating terminals 104 and 106 along rows 100 and 102 are alternately coupled to the first electrode and the second electrode. Similar to the embodiment shown in FIG. 3a, a pair of aligned terminals 104 and 106, such as terminals 104a and 106a, are both coupled to the same electrode.

Bonding wires 116 are used to connect ground and power bonding pads 98a to corresponding terminals 104 of capacitor 92. Leads 118 extend from the side of flex circuit 94 and are electrically connected to ball contacts 104 in a wiring configuration well-known to those skilled in the art. Leads 118 can be considered "package leads" in the sense that flex circuit 94 can correspond to a package (or part of a package) which is connected to chip 90. Lead bonding wires 120 are coupled between leads 118 and inner terminals 106 that are coupled to power and ground bonding pads 98a of chip 90. Bonding pads 98 which are signal bonding pads or other non-ground/power pads are connected directly to corresponding leads 118 by signal bonding wires 122 without being connected to capacitor 92.

In an alternate embodiment, a single row of larger terminals can be used in place of the two rows 100 and 102 of terminals 104 and 106. In such an embodiment, bonding wires 116 connect bonding pads 98 to the single row of capacitor terminals, and lead bonding wires 120 connect the single row of terminals to leads 118 of flex circuit 94. In yet another embodiment, the single row of terminals can be implemented as power and ground rails similar to the rails shown for assembly 56' in FIG. 6.

In other embodiments, chip 90 can be positioned between capacitor 92 and flex circuit 94. In such an embodiment, chip 90 has a smaller surface area than capacitor 92 and is positioned similarly to the chip and capacitor shown in FIGS. 3a, 3b and 4. Signal bonding pads 98 of the chip are directly connected to leads 118 of flex circuit 94. Power and ground bonding pads of chip 90 are connected to corresponding large terminals on capacitor 92 by bonding wires. The terminals of capacitor 92 which correspond and are connected to power and ground bonding pads are connected to leads 118 of flex circuit 94 by lead wires.

Although only a small number of embodiments of the present invention has been described, it should be understood that the present invention may be embodied in many other specific forms without departing from the spirit or scope of the invention. For example, a wide variety of integrated circuit package types can be used with the present invention. In addition, a variety of bonding methods can be used to connect the chip-capacitor assembly to the package, such as TAB methods, flip-chip methods, etc. Therefore, the present examples and embodiments are to be considered as illustrative and not restrictive, and the invention is not to be limited to the details given herein, but may be modified within the scope of the appended claims.

What is claimed is:

1. An apparatus comprising:
   an integrated circuit chip having a circuit and one bonding pad coupled to the circuit, wherein the integrated circuit chip includes a first chip surface and a second chip surface;
   a package lead electrically coupled to the bonding pad for providing a communication path between the circuit via the bonding pad and the lead to a communication location external the integrated circuit chip; and
   a capacitor electrically coupled between the package lead and the bonding pad on the integrated circuit chip, the capacitor including a first electrode and a second electrode, wherein the first electrode of the capacitor includes an electrode surface, at least a portion of the electrode surface contacting the second chip surface, wherein the electrode surface has a greater surface area than the second chip surface.

2. The apparatus of claim 1, wherein the capacitor further comprises a first terminal coupled to a first electrode of the capacitor and a second terminal coupled to a second electrode of the capacitor.

3. The apparatus of claim 2, wherein the bonding pad on the chip is coupled to the first terminal of the capacitor.

4. The apparatus of claim 3, wherein the capacitor further comprises a third terminal coupled to the first electrode and a fourth terminal coupled to the second electrode.

5. The apparatus of claim 4, wherein the bonding pad on the chip is coupled to the first terminal of the capacitor and the package lead is coupled to the third terminal of the capacitor.

6. The apparatus of claim 4, wherein the bonding pad on the chip is coupled to the second terminal of the capacitor and the package lead is coupled to the fourth terminal of the capacitor.

7. The apparatus of claim 2, wherein the bonding pad of the integrated circuit chip is coupled to the second terminal of the capacitor.

8. The apparatus of claim 2, wherein the package lead is coupled to the first terminal of the capacitor.

9. The apparatus of claim 2, wherein the package lead is coupled to the second terminal of the capacitor.

10. The apparatus of claim 2, wherein the integrated circuit chip includes a plurality of bonding pads coupled to the circuit such that the one bonding pad is included within the plurality of bonding pads, a plurality of first terminals coupled to the first electrode, a plurality of second terminals coupled to the second electrode, and a plurality of package leads coupled to the plurality of bonding pads.

11. The apparatus of claim 10, wherein each bonding pad of said plurality of bonding pads has one electrical contact with one of the plurality of said package leads.

12. The apparatus of claim 11, further comprising a flex circuit positioned adjacent a surface of the capacitor, the flex circuit including a plurality of ball contacts electrically coupled between the plurality of said package leads and the communication location external to the chip.

13. The apparatus of claim 11 wherein the plurality of said first and second terminals of the capacitor are alternately coupled to the first electrode and the second electrode.

14. The apparatus of claim 11 wherein the bonding pads include ground bonding pads and power bonding pads, and wherein only the ground bonding pads and the power bonding pads are connected to the plurality of said first terminals and plurality of said second terminals of the capacitor.

15. The apparatus of claim 2 wherein the bonding pad is coupled to one of the first terminal and the second terminal of the capacitor by a bonding wire.

16. The apparatus of claim 15 wherein the package lead is a bonding finger included in a lead frame.

17. The apparatus of claim 1 wherein the capacitor is coupled to the integrated circuit chip by an elastomer layer.

18. The apparatus of claim 1 wherein the first electrode and the second electrode each have a length, a width, and a thickness, and wherein the length and width of the first electrode and the second electrode are substantially equal.

19. A method for providing a semiconductor chip and capacitor assembly, the method comprising the steps of:
   providing an integrated circuit chip having a circuit, a bonding pad coupled to the circuit, a first chip surface, and a second chip surface;
   electrically coupling a package lead to the bonding pad to provide a communication path between the circuit via the bonding pad and the lead to a communication location external to the integrated circuit chip; and
   electrically coupling a capacitor between the package lead and the bonding pad on the integrated circuit chip, the capacitor including an capacitor surface, at least a portion of the capacitor surface contacting the second chip surface, wherein the capacitor surface has a greater surface area than the second chip surface.

20. A method as recited in claim 19 wherein said capacitor includes a plurality of electrodes, wherein the capacitor surface is a surface of one of the electrodes, and wherein the step of coupling a capacitor includes coupling a capacitor having a terminal coupled to one of the plurality of said electrodes.

21. A method as recited in claim 20, wherein the terminal of the capacitor is coupled to the bonding pad on the chip.

22. The method of claim 19, further comprising a step of providing a flex circuit positioned adjacent a surface of the capacitor, the flex circuit including a plurality of ball contacts electrically coupled between the package lead and the communication location external to the chip.

23. The method claim 19 wherein the capacitor is coupled to the bonding pad by a bonding wire.

24. The method of claim 23 wherein said step of coupling a package lead includes coupling a bonding finger included in a lead frame to provide the communication path between the circuit and the communication location external to the integrated circuit chip.

25. An apparatus comprising:
   an integrated circuit chip having a circuit and including a plurality of bonding pads coupled to the circuit;
   a plurality of package leads coupled to the plurality of bonding pads for providing a communication path between the circuit via the plurality of bonding pads and the plurality of leads to a communication location external the integrated circuit chip, wherein each bonding pad of said plurality of bonding pads has one electrical contact with one of the plurality of said package leads;
   a capacitor coupled between the plurality of package leads and the plurality of bonding pads on the integrated circuit chip, wherein the capacitor is physically positioned adjacent to a surface of the integrated circuit chip; and a flex circuit positioned adjacent a surface of the capacitor, the flex circuit including a plurality of contacts electrically coupled between the plurality of said package leads and the communication location external to the chip.

26. The apparatus of claim 25 wherein the plurality of contacts included in the flex circuit are ball contacts.

27. The apparatus of claim 26 wherein the capacitor is coupled to the integrated circuit chip by an elastomer layer.

28. The apparatus of claim 25 wherein the flex circuit includes a micro ball grid array.

29. A method for providing a semiconductor chip and capacitor assembly, the method comprising the steps of:

providing an integrated circuit chip having a circuit and one bonding pad coupled to the circuit;

coupling a package lead to the bonding pad to provide a communication path between the circuit via the bonding pad and the lead to a communication location external to the integrated circuit chip;

coupling a capacitor between the package lead and the bonding pad on the integrated circuit chip, the capacitor being provided adjacent to a side of the chip; and providing a flex circuit positioned adjacent to a surface of the capacitor, the flex circuit including a ball contact electrically coupled between the package lead and the communication location external to the chip.

30. The method of claim 29 wherein the capacitor has a smaller surface area than the integrated circuit chip.

* * * * *